United States Patent [19]

Cunningham

[11] 4,380,711
[45] Apr. 19, 1983

[54] LINEARIZATION CIRCUIT

[75] Inventor: Vernon R. Cunningham, Melissa, Tex.

[73] Assignee: Rockwell International Corporation, El Segundo, Calif.

[21] Appl. No.: 216,398

[22] Filed: Dec. 15, 1980

[51] Int. Cl.³ .............................................. H03K 4/00
[52] U.S. Cl. .................................... 307/491; 307/492; 307/499; 307/555; 330/279
[58] Field of Search ............... 330/149, 279; 307/318, 307/297, 491, 492, 493, 499, 500, 552, 555; 328/145, 162; 455/239, 253

[56] References Cited

U.S. PATENT DOCUMENTS

| | | | |
|---|---|---|---|
| 3,523,198 | 8/1970 | Keller | 307/318 X |
| 3,781,648 | 12/1973 | Owens | 307/297 X |
| 3,899,693 | 8/1975 | Gaudreault | 307/297 |
| 4,101,841 | 7/1978 | Okada et al. | 330/279 X |

*Primary Examiner*—James B. Mullins

*Attorney, Agent, or Firm*—Michael E. Taken; Bruce C. Lutz; Howard R. Greenberg

[57] ABSTRACT

A two terminal transfer linearization circuit is provided for linearizing the AGC voltage of an AGC amplifier by providing a selectively controllable nonlinear current-vs-voltage response curve with adjustable curvature. A pair of end terminals have a first circuit branch therebetween forming a voltage divider for supplying base drive voltage to a transistor in a second parallel circuit branch between the end terminals. A third parallel resistorless circuit branch is provided through a second transistor having base drive voltage across a third resistor in the second circuit branch. As the voltage across the end terminals increases, the current through the first transistor increases and this current increases the base drive voltage to the second transistor to turn on the latter in nonlinear manner. The shape and curvature of the resultant current-vs-voltage response curve is selectively adjusted by variable resistors in the first and second circuit branches.

3 Claims, 3 Drawing Figures

LINEARIZATION CIRCUIT

TECHNICAL FIELD

The invention relates to circuitry providing a nonlinear voltage-vs-current response curve for compensating an already existant nonlinearity in a circuit, for example to linearize AGC (automatic gain control) voltage such that it is a linear function of the received carrier level in telecommunication equipment.

BACKGROUND

In long distance telecommunication, received carrier levels are amplified to usable values with an AGC amplifier. It is desirable to linearize the AGC voltage (which controls the AGC amplifier) such that it is a linear function of the received carrier level. Various techniques have been used to accomplish this linearization, and typically involve auxiliary circuitry having a nonlinear response for compensating the existing nonlinear signal response curve.

One type of scheme is generally referred to as a successive approximation method. This method involves the use of a plurality of diodes which variously turn on at their correspondent threshold levels as the nonlinear input rises. The more diodes which turn on, the greater current is drawn. Though the nonlinear input is a continuously variable curve, the compensating adjustments are in a step-wise fashion because of the diodes, and hence this method is sometimes referred to as the piece-wise linear method because the diodes create a transfer characteristic of a series of connected straight lines of varying slope. Accuracy can be improved by adding more diodes, but this increases cost and complexity.

Another scheme is the logarithmic approximation method. This method makes use of the fact that the input signal response curve to be linearized is approximately logarithmic, and that older type low voltage zener diodes also exhibit this characteristic in the vicinity of their reverse threshold breakover, or knee. A regular diode, although logarithmic, has a very small usable voltage differential, so small as to make it unusable for this type of application. An older type zener diode, however, biased on the knee of its response curve, has a much longer usable region because of what is known as a sloppy knee wherein the reverse breakover is not sharp but rather more gradual and including a logarithmic type curvature portion. A disadvantage of this technique is the noise encountered which is inherent in zener diodes. Another disadvantage of this technique is the limited sourcing availability. Almost all zener diodes are now made with improved characteristics providing a very sharp reverse breakover threshold or knee which is not suited to the above linearization technique.

SUMMARY

The present invention provides a linearization circuit which is particularly simple and efficient. The circuit provides a nonlinear voltage-vs-current logarithmic response curve with selectably adjustable curvature for providing variable curvature compensation. This adjustable compensating curvature is particularly desirable for use in compensating an already existent nonlinearity.

The invention is particularly advantageous in providing variable curvature compensation in a two terminal transfer linearization circuit for linearizing the AGC voltage of an AGC amplifier by providing a selectively controllable nonlinear current-vs-voltage response curve with adjustable curvature.

DETAILED DESCRIPTION

Figure 1:
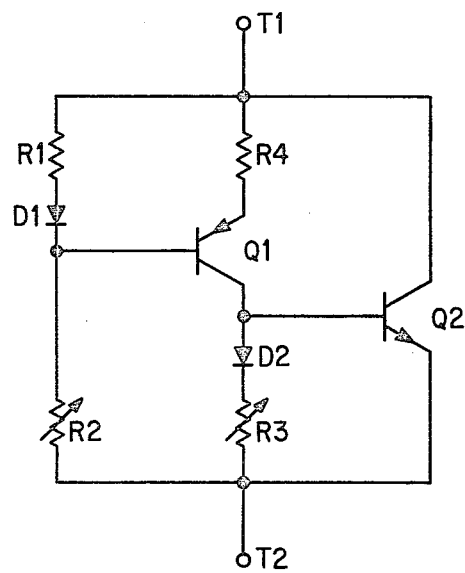
FIG. 1 is a circuit diagram of a linearization circuit constructed in accordance with the invention.

The linearization circuit in FIG. 1 has first and second end terminals T1 and T2. Three parallel circuit branches are connected between end terminals T1 and T2. The first circuit branch has first and second series resistors R1 and R2 forming a voltage divider, and a series diode D1 therebetween. The second circuit branch is connected through a resistor R4, the emitter-collector of a first transistor Q1, a diode D2, and a resistor R3. The base of Q1 is connected to a point between D1 and R2. The third circuit branch is connected through the collector-emitter of a second transistor Q2. The base of Q2 is connected to a point between the collector of Q1 and the anode of D2.

As the voltage across T1 and T2 increases, the current through Q1 (from emitter to collector) increases because of the voltage drop across R1 and D1. D1 provides temperature compensation of the emitter-base semiconductor junction of Q1. The current through Q1 increases the voltage across D2 and R3, causing Q2 to turn on in a nonlinear manner since its base to emitter voltage is a logarithmic function of the emitter current. D2 provides temperature compensation of the base-emitter semiconductor junction of Q2. The shape of the resultant current-vs-voltage characteristic response curve across T1 and T2 is determined by the voltage across R3 and the rate of change of this voltage with respect to the input voltage across T1 and T2. R2 and R3 are variable resistors providing convenient adjustment.

Figure 2:
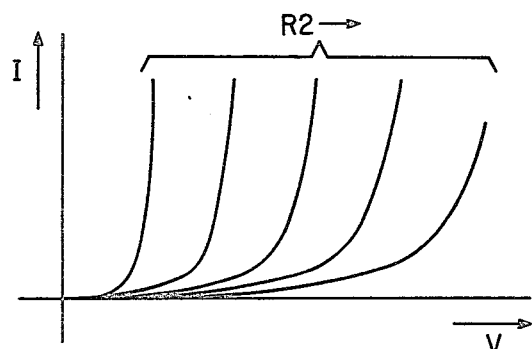
FIG. 2 graphically shows an oscilloscope trace of the voltage-vs-current response curve of the circuit of FIG. 1 for different values of R2.
Figure 3:
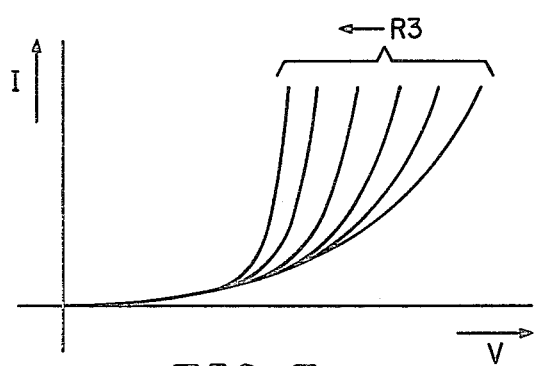
FIG. 3 graphically shows an oscilloscope trace of the voltage-vs-current response curve of the circuit of FIG. 1 for different values of R3.

Referring to FIG. 2, the current-vs-voltage response curve across T1 and T2 is shown for different values of R2. The left-most curve is for the lowest value of R2, and the right-most curve is for the highest value of R2. FIG. 3 shows response curves for different values of R3. The left-most curve is for the highest value of R3, and the right-most curve is for the lowest value of R3.

The current through Q1 is controlled by the base drive voltage drop across R1. The current through Q2 is controlled by the base drive voltage drop across R3. Increasing values of R2 cause increasing portions of the voltage between T1 and T2 to be dropped across R2, and decreasing portions to be dropped across R1, whereby to require higher voltages between T1 and T2 to cause turn on of Q1. This results in later turn-on of Q1 relative to increasing voltage across T1 and T2, as shown by FIG. 2. Increasing values of R3 cause earlier turn-on of Q2 relative to increasing voltage across T1 and T2, as shown by FIG. 3. The nonlinear current-vs-voltage response curve across T1 and T2 has selectively adjustable curvature controlled by R2 and R3.

The circuit of FIG. 1 is a two terminal device. This is significant because it eliminates any need for a triggering or gate signal to be applied thereto and any attendant gating circuitry. This is further significant because a two terminal device can easily be substituted in existing AGC circuitry for prior diode schemes and the like which typically are two terminal arrangements. This cost effective amenability to existing AGC voltage linearization systems is significant.

Another significant aspect is that the conduction path from T1 through the third circuit branch containing Q2 to T2 has no interposed resistor which would otherwise make the voltage-vs-current response more linear. This resistorless third circuit branch furthers realization of a nonlinear voltage to current characteristic.

It is recognized that various modifications are possible within the scope of the appended claims.

I claim:

1. A two terminal circuit providing a nonlinear voltage-vs-current logarithmic response curve with selectably adjustable curvature for providing variable curvature compensation, comprising:
   first and second end terminals T1 and T2;
   three parallel circuit branches between said end terminals;
   the first of said circuit branches having first and second series resistors R1 and R2 forming a voltage divider;
   the second of said circuit branches being through the emitter-collector of a first transistor Q1 and through a third resistor R3, the base of Q1 being connected to a point between R1 and R2; and
   the third of said circuit branches being through the emitter-collector of a second transistor Q2, the base of Q2 being connected to a point between R2 and Q1,
   wherein current through Q1 is controlled by base drive voltage drop across R1, and current through Q2 is controlled by base drive voltage drop across R3, such that increasing voltage across T1 and T2 causes increasing current through Q1 which increases the voltage across R3, causing Q2 to turn on with nonlinear response such that the shape and curvature of the resultant current-vs-voltage characteristic curve is determined by the voltage across R3 and the rate of change of this voltage relative to the voltage across T1 and T2,
   wherein R2 and R3 are adjutable resistors such that increasing values of R2 cause increasing portions of the voltage between T1 and T2 to be dropped across R2 and decreasing portions to be dropped across R1, whereby to require higher voltages between T1 and T2 to cause turn-on of Q1, and thus cause later turn-on of Q1 relative to increasing voltage across T1 and T2, and such that increasing values of R3 cause earlier turn-on of Q2 relative to increasing voltage across T1 and T2, whereby to provide a two terminal nonlinear current-vs-voltage response curve across T1 and T2 with selectively adjustable curvature controlled by R2 and R3, and
   wherein the emitter of Q1 is connected through a fourth resistor R4 to T1;
   R1 and a first diode D1 are connected between T1 and the base of Q1;
   the collector of Q1 is connected through a second diode D2 and R3 to T2;
   R2 is connected between T2 and the base of Q1;
   the collector of Q2 is connected to T1;
   the emitter of Q2 is connected to T2; and
   D2 and R3 are connected between T2 and a point common to the collector of Q1 and the base of Q2.

2. A two terminal transfer linearization circuit for linearizing the AGC voltage of an AGC amplifier by providing a selectively controllable nonlinear current-vs-voltage response curve with adjustable curvature, comprising:
   first and second end terminals T1 and T2;
   three parallel circuit branches between T1 and T2;
   the first of said circuit branches having first and second series resistors R1 and R2 forming a voltage divider;
   the second of said circuit branches being through the emitter-collector of a first transistor Q1, through a third resistor R3 and through a fourth resistor R4 in the emitter leg of transistor Q1, the base of Q1 being connected to a point between R1 and R2 such that the current through Q1 is controlled by the base drive voltage drop across R1 and such that increasing values of R2 cause increasing portions of the voltage between T1 and T2 to be dropped across R2 and decreasing portions to be dropped across R1, whereby to require higher voltages between T1 and T2 to cause turn-on of Q1 and thus cause later turn-on of Q1 relative to increasing voltage across T1 and T2;
   the third of such circuit branches being connected through the emitter-collector of a second transistor Q2, the base of Q2 being connected to a point between R3 and the collector of Q1, such that the current through Q2 is controlled by base drive voltage drop across R3 and such that increasing values of R3 cause earlier turn-on of Q2 relative to increasing voltage across T1 and T2, such that increasing voltage across T1 and T2 causes increasing current through Q1 which increases the voltage across R3, causing Q2 to turn on with nonlinear response such that the shape and curvature of the resultant current-vs-voltage characteristic curve is determined by the voltage across R3 and the rate of change of this voltage relative to the voltage across T1 and T2, whereby to provide a two terminal nonlinear current-vs-voltage response curve across T1 and T2 with selectively adjustable curvature.

3. Variable impedance circuit element means for use as a variable curvature compensation load in an amplifier circuit to minimize nonlinearities in a signal introduced by AGC circuitry upstream in a signal path comprising, in combination:
   a first parallel circuit branch comprising resistors R1 and R2;
   a second parallel circuit branch comprising R3, a transistor Q1 and a resistor R4 where R4 is a common emitter impedance for Q1, R3 is a collector load impedance for Q1 and the base of Q1 is connected to a point in said first circuit branch between R1 and R2; and
   a third parallel circuit branch comprising a collector-emitter path of a transistor Q2 having its base connected to the collector of Q1 and wherein,
   the curvature is varied in accordance with changes in the value of resistance in resistors R2 and R3.

* * * * *